United States Patent [19]

Zeiner et al.

[11] Patent Number: 5,442,042
[45] Date of Patent: Aug. 15, 1995

[54] SURFACE TREATMENT OF POLYAMIDE MOLDINGS AND MOLDINGS OBTAINED THEREBY

[75] Inventors: Hartmut Zeiner; Walter Betz, both of Ludwigshafen; Graham E. McKee, Weinheim, all of Germany

[73] Assignee: BASF Aktiengesellschaft, Ludwigshafen, Germany

[21] Appl. No.: 162,201

[22] PCT Filed: Jun. 11, 1992

[86] PCT No.: PCT/EP92/01312

§ 371 Date: Dec. 16, 1993

§ 102(e) Date: Dec. 16, 1993

[87] PCT Pub. No.: WO93/00392

PCT Pub. Date: Jan. 7, 1993

[30] Foreign Application Priority Data

Jun. 22, 1991 [DE] Germany .......................... 41 20 723.8

[51] Int. Cl.⁶ ..................... C08J 3/00; C08F 8/00; B05D 3/10
[52] U.S. Cl. ..................... 528/502; 528/322; 528/480; 427/306; 427/307; 427/322; 264/129; 264/340
[58] Field of Search ............ 528/322, 480, 502; 427/306, 307, 322; 264/129, 340

[56] References Cited

U.S. PATENT DOCUMENTS 3,556,882 1/1971 Fishman et al. .................. 156/668
5,192,477 3/1993 Betz et al. ........................ 528/502

FOREIGN PATENT DOCUMENTS 056986 8/1982 European Pat. Off. .
402750 12/1990 European Pat. Off. .
3137587 9/1981 Germany .
2018791 10/1979 United Kingdom .

OTHER PUBLICATIONS

Probleme bei der Metallisierung von Polyamid, Seidenspinner Galvanofechnik, 75 (1984) Nr. 7.
Metallisierung von Polyamid-Spritzgussteilen, Galvanotechnik 79 (1988) Nr. 1, Wolf et al.

Primary Examiner—Paul R. Michl
Assistant Examiner—P. Hampton-Hightower
Attorney, Agent, or Firm—Keil & Weinkauf

[57] ABSTRACT

Moldings based on polyamides are surface treated with mixtures of at least 20% strength by weight aqueous hydrochloric acid with mono- or diethers of an aliphatic polyfunctional hydroxy compound in a mixing ratio of from 90:10 to 10:90% by volume.

6 Claims, No Drawings

SURFACE TREATMENT OF POLYAMIDE MOLDINGS AND MOLDINGS OBTAINED THEREBY

BACKGROUND OF THE INVENTION

1. Field of the Invention

The present invention relates to a process for the surface treatment of moldings based on polyamides by treatment with aqueous acids.

The present invention further relates to moldings obtainable by this process and to the use thereof for metallization, i.e. for coating with metals.

Polyamides are engineering plastics and have found wide utility in many areas.

However, an interesting area has hitherto been largely denied to polyamides—the field of metallized materials. The reason for this is mainly the inadequate adhesion of the metal layer on the polyamide. This matter is discussed in a paper by Seldenspinner (Galvanotechnik 75 (1984), 852), and various possible solutions are tentatively hinted at, for example treatment with aqueous hydrochloric acid. In Galvanotechnik 79 (1988), 54, a process is described for the surface treatment of polyamide injection moldings wherein activation in a bath containing palladium salts is followed by surface roughening in a bath containing calcium and aluminum salts. This process is commercially disadvantageous because of the expensive materials used, nor is the adhesion obtained fully satisfactory.

2. Review of Related Art

EP-A 56 986 discloses polyamide molding compositions which contain from 30 to 60% by weight of wollastonite as filler and are suitable in particular for metallization. The pretreatment is carried out with a from 4 to 15% strength solution of hydrochloric acid or sulfuric acid, which by attacking the filler particles produces a roughening of the surface; that is, the filler is absolutely necessary for obtaining good adhesion between metal and polyamide. However, the high filler content impairs the quality of the surface, which is a disadvantage for decorative purposes.

EP-A 402 750 discloses a process of surface treatment and subsequent metallization for polyamides. In this process partly aromatic copolyamides are treated with aqueous $H_3PO_4$ and metallized. However, partly crystalline or amorphous polyamides which can be composed of aromatic monomer units cannot be satisfactorily metallized by this process. The adhesion obtained is not sufficient for some applications.

SUMMARY OF THE INVENTION

It is an object of the present invention to provide a process for the surface treatment of moldings based on polyamides that is free of the above-described disadvantages and gives moldings which are subsequently readily metallizable.

We have found that this object is achieved according to the invention by a process for surface treatment of moldings based on polyamides by treatment with aqueous acids, which comprises using a mixture of at least 20% strength by weight aqueous hydrochloric acid with a mono- or diether of an aliphatic polyfunctional hydroxy compound in a mixing ratio of from 90:10 to 10:90. The weight percentage is based on the HCl content at 20° C., which should be at least 20% by weight, preferably at least 25% by weight and in particular at least 30% by weight.

DESCRIPTION OF PREFERRED EMBODIMENTS

The process of the invention is suitable for the surface treatment of moldings based on polyamides, i.e. moldings which contain a thermoplastic polyamide as an important constituent. The thermoplastic polyamide may have been modified with fillers, polymers which improve the impact toughness, other polymers or flame retardants.

Suitable polyamides are known per se and encompass the semicrystalline and amorphous resins having weight average molecular weights of at least 5,000 which are customarily referred to as nylons. Such polyamides are described for example in U.S. Pat. Nos. 2,071,250, 2,071,251, 2,130,523, 2,130,948, 2,241,322, 2,312,966, 2,512,606 and 3,393,210.

The polyamides can be prepared for example by condensation of equimolar amounts of a saturated or an aromatic dicarboxylic acid of from 4 to 12 carbon atoms with a diamine of from 4 to 14 carbon atoms, or by condensation of ω-aminocarboxylic acids or polyaddition of lactams. Examples of polyamides are polyhexamethyleneadipamide (nylon 66), polyhexamethyleneazelamide (nylon 69), polyhexammethylenesebacamide (nylon 610), polyhexamethylenedodecynediamide (nylon 612), the polyamides obtained by ring opening of lactams, such as polycaprolactam and polylauryllactam, also poly-11-aminoundecanoic acid and a polyamide of bis(p-aminocyclohexylmethane) and dodecanedioic acid. It is also possible to use polyamides prepared by copolycondensation of two or more of the abovementioned polymers or their components, for example a copolymer of caprolactam, terephthalic acid and hexamethylenediamine. Preferably, the polyamides are linear and have melting points of more than 200° C.

Preferred polyamides are polyhexamethyleneadipamide, polyhexamethylenesebacamide and polycaprolactam. The polyamides have in general a relative viscosity of from 2.5 to 5, determined on a 1% strength by weight solution in 96% strength sulfuric acid at 23° C., which corresponds to a weight average molecular weight of from about 15,000 to about 45,000. Polyamides having a relative viscosity of from 2.5 to 4.0, in particular from 2.6 to 3.5, are preferred.

Processes for preparing such polyamides are known per se and are described in the literature.

Fillers, impact-modifying polymers and flame retardants for polyamides are known per se to the person skilled in the art and are described in the literature, so that no details are required here.

Merely by way of example there may be mentioned here, as a mixture of polyamide and another polymer, a polymer blend of polyamide and polyphenylene ether.

The moldings can be produced from the above-described polyamide molding compositions in a conventional manner, for example by extrusion, injection or blow molding, to name Just three possibilities. The processing conditions will of course depend on the composition of the polyamide material and are known to the person skilled in the art.

The surface treatment of moldings based on polyamides is effected with the aid of a mixture of at least 20% strength by weight hydrochloric acid and a mono- or diether of an aliphatic polyfunctional hydroxy compound in a mixing ratio of from 90:10 to 10:90, preferably from 30:70 to 70:30, in particular 50:50, % by volume.

The duration and temperature of the treatment are related; the higher the temperature, the shorter the treatment time. An increase in the concentration of the HCl content likewise results in a shorter treatment time.

Preference is given to a temperature of from 10° to 80° C., in particular from 15° to 45° C., and very particularly from 18° to 35° C.

The treatment time is preferably within the range from 0.5 to 25 minutes, in particular from 1 to 15 minutes, especially from 5 to 10 minutes.

It has been found to be advantageous if, given a phosphoric acid concentration of from 35 to 37% by weight, the product of treatment temperature in degrees Celsius and treatment time in seconds is within the range from 1000 to 21,000, since the metallization of so pretreated moldings gives particularly good adhesion results.

The pretreatment mixture contains as a further ingredient a mono- or diether of an aliphatic polyfunctional hydroxycompound of the general formula I

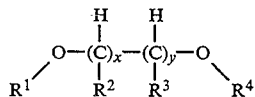

where
R$^1$ is hydrogen or C$_1$- to C$_{10}$-alkyl,
R$^2$ is hydrogen, C$_1$- to C$_{10}$-alkyl or hydroxyl,
R$^3$ is hydrogen or C$_1$- to C$_{10}$-alkyl,
R$^4$ is hydrogen, C$_1$- to C$_{10}$-alkyl or —(CH$_2$)$_n$—OR$^5$,
R$^5$ is hydrogen or C$_1$- to C$_{10}$-alkyl,
x is an integer from 1 to 10,
y is 0 or 1, and
n is an integer from 2 to 4.

Preferred radicals R$^1$ are methyl, ethyl, propyl and n-butyl, and R$^2$ is preferably hydrogen, methyl or hydroxyl—and if it is hydroxyl x should be at least 2. R$^3$ is preferably methyl or hydrogen, R$^4$ is hydrogen or a (CH$_2$)$_n$OR$^5$ group, where n is preferably 2 or 3, and R$^5$ is preferably methyl.

Preferred compounds of the general formula are 1-methoxy-2-hydroxypropane (propylene glycol 1-methyl ether), dipropylene glycol monomethyl ether, ethylene glycol monomethyl ether and diethylene glycol monomethyl ether and also di- or monomethyl ethers of glycerol.

Such additives are generally known and commercially available (e.g. Solvenon ® or methylglycol).

After the pretreatment the moldings are advantageously freed of adhering acid residues by rinsing in water.

Thereafter the moldings can be metallized in a conventional manner.

In general the sequence is activation, reduction, chemical metallization and, finally, electrometallization.

The products obtained have particularly high adhesion values, generally within the range from 1.25 to 5N/mm (measured in accordance with DIN 53 289 by the roller peel test).

The effect of the treatment with HCl is to modify the amino groups of the polyamide present in the surface layer, particularly good results being obtained if at least 5 mol % of the amino groups originally present are modified in a surface layer of not more than 100 μm thickness.

It is clear from the above that the moldings of the invention are suitable in particular for subsequent metallization. The metallized moldings thus obtained can be used in many areas, for example in the automotive sector or in the field of electrical engineering and electronics.

Moreover, moldings treated by the process of the invention are also readily lacquerable and printable.

EXAMPLES

The following polyamides were used:
PA(1)
64% by weight of a random copolyamide where 85% of the repeat units are derived from hexamethyleneadipamide and from ε-caprolactam.
30% by weight of wollastonite,
6% by weight of impact modifier:
  59.8% by weight of ethylene
  35% by weight of n-butyl acrylate
  4.5% by weight of acrylic acid
  0.7% by weight of maleic anhydride
(Ultramid ® C3ZM6 from BASF AG).
PA(2)
70% by weight of poly(ε-caprolactam) $\eta_{rel}$=2.7
(1 g/100 ml of 96% strength by weight H$_2$SO$_4$)
30% by weight of wollastonite
(Ultramid ® B3M6 from BASF AG).
PA(3)
61.5% by weight of polyhexamethyleneadipamide $\eta_{rel}$=2.7
25% by weight of glass fiber
6% by weight of red phosphorus
6% by weight of impact modifier (see PA(1))
1.5% by weight of zinc oxide
(Ultramid ® A3X2 G5 from BASF AG).
PA(4)
59.4% by weight of partly aromatic copolyamide composed of units derived from ε-caprolactam and terephthalic acid/hexamethylenediamine in a weight ratio of 70:30 (prepared as described in Example 1 of EP-A 299 444).
16.3% by weight of brominated polystyrene having a bromine content of 67% (Pyrocheck ® 68 PB from Ferro Corp.)
25% by weight of glass fiber
3.8% by weight of antimony trioxide
(Ultramid T grade from BASF AG)

A 2.0 mm thick sheet of polyamide was treated with an etching medium of the temperature and composition specified in the Table for the period specified in the Table. The sheet obtained was then rinsed off with distilled water and dried.

Metallization followed in a conventional manner, the end result being a from 25 to 50 μm thick copper layer on the polyamide sheet.

The results of the roller peel test in accordance with DIN 53 289 and the temperature change resistance test in accordance with DIN 53 496 are likewise listed in the Table.

For comparison (C), identical polyamide sheets were pretreated with aqueous solutions of other acids and other concentrations (as per the Table) and identically metallized. The results are likewise shown in the Table.

TABLE 1

| Example | Polyamide | Etching medium | Volume ratio | Pretreatment Temp. °C. | Pretreatment Time min. | Temperature change test class A | Metal peel strength [N/mm] |
|---|---|---|---|---|---|---|---|
| 1 | (1) | Propylene glycol 1-methyl ether/37% strength by weight HCl | 2:1 | 23 | 15 | pass | ≧2 |
| 2 | (2) | Propylene glycol 1-methyl ether/37% strength by weight HCl | 2:1 | 23 | 15 | pass | ≧2 |
| 3 | (3) | Propylene glycol 1-methyl ether/37% strength by weight HCl | 2:1 | 23 | 15 | pass | ≧1 |
| 4 | (1) | Propylene glycol 1-methyl ether/37% strength by weight HCl | 1:1 | 23 | 10 | pass | ≧1 |
| 5 | (2) | Propylene glycol 1-methyl ether/37% strength by weight HCl | 1:1 | 23 | 10 | pass | ≧1 |
| 6 | (3) | Propylene glycol 1-methyl ether/37% strength by weight HCl | 1:1 | 23 | 10 | pass | ≧1 |
| 7 | (1) | Propylene glycol 1-methyl ether/37% strength by weight HCl | 1:2 | 23 | 5 | pass | ≧1 |
| 8 | (2) | Propylene glycol 1-methyl ether/37% strength by weight HCl | 1:2 | 23 | 5 | pass | ≧1 |
| 9 | (3) | Propylene glycol 1-methyl ether/37% strength by weight HCl | 1:2 | 23 | 5 | pass | ≧2 |
| C1 | (4) | Propylene glycol 1-methyl ether/37% strength by weight HCl | 2:1 | 23 | 5 | — | <0.5 |
| C2 | (4) | Propylene glycol 1-methyl ether/37% strength by weight HCl | 1:1 | 23 | 10 | — | <0.5 |
| C3 | (4) | Propylene glycol 1-methyl ether/37% strength by weight HCl | 1:2 | 23 | 15 | — | <0.5 |
| 10 | (1) | Dipropylene glycol monomethyl ether/37% strength by weight HCl | 2:1 | 23 | 20 | pass | ≧1 |
| 11 | (2) | Dipropylene glycol monomethyl ether/37% strength by weight HCl | 2:1 | 23 | 20 | pass | ≧1 |
| 12 | (3) | Dipropylene glycol monomethyl ether/37% strength by weight HCl | 2:1 | 23 | 20 | pass | ≧1 |
| 13 | (1) | Dipropylene glycol monomethyl ether/37% strength by weight HCl | 1:1 | 23 | 15 | pass | ≧1 |
| 14 | (2) | Dipropylene glycol monomethyl ether/37% strength by weight HCl | 1:1 | 23 | 15 | pass | ≧1 |
| 15 | (3) | Dipropylene glycol monomethyl ether/37% strength by weight HCl | 1:1 | 23 | 15 | pass | ≧1 |
| 16 | (1) | Dipropylene glycol monomethyl ether/37% strength by weight HCl | 1:2 | 23 | 10 | pass | ≧1 |
| 17 | (2) | Dipropylene glycol monomethyl ether/37% strength by weight HCl | 1:2 | 23 | 10 | pass | ≧1 |
| 18 | (3) | Dipropylene glycol monomethyl ether/37% strength by weight HCl | 1:2 | 23 | 10 | pass | ≧1 |
| C4 | (4) | Dipropylene glycol monomethyl ether/37% strength by weight HCl | 2:1 | 23 | 20 | — | <0.5 |
| C5 | (4) | Dipropylene glycol monomethyl ether/37% strength by weight HCl | 1:1 | 23 | 15 | — | <0.5 |
| C6 | (4) | Dipropylene glycol monomethyl ether/37% strength by weight HCl | 1:2 | 23 | 10 | — | <0.5 |
| C7 | (1) | Propylene glycol 1-methyl ether/10% strength by weight HCl | 1:2 | 23 | 15 | fail | <0.5 |
| C8 | (1) | Propylene glycol 1-methyl ether/10% strength by weight HCl | 1:2 | 40 | 15 | pass | <0.5 |
| C9 | (1) | Propylene glycol 1-methyl ether/10% strength by weight HCl | 2:1 | 23 | 15 | fail | <0.5 |
| C10 | (1) | Propylene glycol 1-methyl ether/10% strength by weight HCl | 2:1 | 40 | 15 | fail | <0.5 |
| C11 | (1) | Propylene glycol 1-methyl ether/70% strength by weight HCOOH | 1:2 | 23 | 15 | fail | <0.3 |
| C12 | (1) | Propylene glycol 1-methyl ether/70% strength by weight HCOOH | 1:2 | 40 | 15 | fail | <0.3 |
| C13 | (1) | Propylene glycol 1-methyl ether/70% strength by weight H3PO4 | 1:2 | 20 | 15 | fail | <0.5 |
| C14 | (1) | No pretreatment | | | | fail | no adhesion whatsoever |
| C15 | (1) | Chromic sulfuric acid | | 23 | 6 | fail | <0.1 |
| C16 | (1) | Sulfuric acid 45% strength by weight | | 40 | 30 | fail | <0.1 |
| C17 | (1) | 50% strength by weight HNO3 | | 23 | 5 | fail | <0.1 |
| C18 | (1) | 37% strength by weight HCl | | 23 | 30 | fail | <0.3 |
| C19 | (1) | 37% strength by weight HCl | | 40 | 10 | fail | <0.3 |
| C20 | (1) | Oxalic acid (saturated solution) | | 60 | 10 | fail | <0.1 |
| C21 | (1) | Boric acid | | 60 | 10 | fail | <0.1 |
| C22 | (1) | Acetic acid (conc.) | | 70 | 60 | fail | <0.3 |
| C23 | (1) | Trichloroacetic acid (conc.) | | 23 | 15 | fail | <0.3 |

TABLE 1-continued

| Example | Polyamide | Etching medium | Volume ratio | Pretreatment Temp. °C. | Time min. | Temperature change test class A | Metal peel strength [N/mm] |
|---|---|---|---|---|---|---|---|
| C24 | (1) | 70% strength by weight $H_3PO_4$ | | 23 | 20 | fail | <0.5 |

We claim:

1. A process for surface treatment of moldings based on polyamides by treatment with aqueous acids, which comprises: applying to the surface of the molding a mixture of at least 20% strength by weight aqueous hydrochloric acid and a mono- or diether of an aliphatic polyfunctional hydroxy compound of the formula I

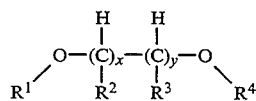

where
$R^1$ is hydrogen or $C_1$- to $C_{10}$-alkyl,
$R^2$ is hydrogen, $C_1$- to $C_{10}$-alkyl or hydroxyl,
$R^3$ is hydrogen or $C_1$- to $C_{10}$-alkyl,
$R^4$ is hydrogen, $C_1$- to $C_{10}$alkyl or $-(CH_2)_n-OR^5$,
$R^5$ is hydrogen or $C_1$- to $C_{10}$-alkyl,
x is an integer from 1 to 10,
y is 0 or 1, and
n is an integer from 2 to 4
the mixing ratio of the two components being from 90:10 to 10:90% by volume.

2. A process as defined in claim 1, wherein the treatment is carried out at from 10 to 80° C.

3. A process as defined in claim 1, wherein the treatment is carried out for from 0.5 to 25 minutes.

4. A surface treated molding obtained by the process defined in claim 1.

5. A polyamide molding in which in a surface layer of not more than 100 μm thickness at least 5 mol % of the amino groups originally present have been modified by reaction with HCl.

6. A process for metalizing a polyamide molding which comprises surface treating the molding with a mixture of at least 20% by weight aqueous hydrochloric acid and a mono- or diether of a aliphatic polyfunctional hydroxy compound of the formula I

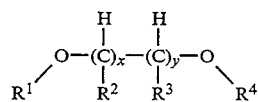

where
$R^1$ is hydrogen or $C_1$- to $C_{10}$-alkyl,
$R^2$ is hydrogen, $C_1$- to $C_{10}$-alkyl or hydroxyl,
$R^3$ is hydrogen or $C_1$- to $C_{10}$-alkyl,
$R^4$ is hydrogen, $C_1$- to $C_{10}$-alkyl or $-(CH_2)_n-OR^5$,
$R^5$ is hydrogen or $C_1$- to $C_{10}$-alkyl,
x is an integer from 1 to 10,
y is 0 or 1, and
n is an integer from 2 to 4
in a mixing ratio of the two components of from 90:10 to 10:90 % by weight; and thereafter applying a metal layer to the treated surface.

* * * * *

UNITED STATES PATENT AND TRADEMARK OFFICE
CERTIFICATE OF CORRECTION

PATENT NO.: 5,442,042

DATED: August 15, 1995

INVENTOR(S): ZEINER et al.

It is certified that error appears in the above-identified patent and that said Letters Patent is hereby corrected as shown below:

Column 7, claim 1, line 28, "$C_1$- to $C_{10}$alkyl" should read --$C_1$- to $C_{10}$-alkyl--.

Column 8, claim 5, line 30, "2)-$_n$-OR$^5$" should read --2)$_n$-OR$^5$--.

Signed and Sealed this

Seventeenth Day of October, 1995

*Attest:*

BRUCE LEHMAN

*Attesting Officer*  *Commissioner of Patents and Trademarks*